United States Patent
Hashimoto

(10) Patent No.: US 11,404,843 B2
(45) Date of Patent: Aug. 2, 2022

(54) LIGHT EMISSION DEVICE

(71) Applicant: NICHIA CORPORATION, Anan (JP)

(72) Inventor: Takuya Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 138 days.

(21) Appl. No.: 17/017,273

(22) Filed: Sep. 10, 2020

(65) Prior Publication Data

US 2021/0083451 A1  Mar. 18, 2021

(30) Foreign Application Priority Data

Sep. 13, 2019 (JP) ............................. JP2019-167474

(51) Int. Cl.
*H01L 33/62* (2010.01)
*H01S 5/02216* (2021.01)
*H01S 5/02345* (2021.01)
*H01L 33/48* (2010.01)

(52) U.S. Cl.
CPC ........ *H01S 5/02216* (2013.01); *H01L 33/483* (2013.01); *H01L 33/62* (2013.01); *H01S 5/02345* (2021.01)

(58) Field of Classification Search
CPC ............. H01S 5/02216; H01S 5/02345; H01L 33/483; H01L 33/62
USPC ........................................................ 362/147
See application file for complete search history.

(56) References Cited

U.S. PATENT DOCUMENTS

| | | | |
|---|---|---|---|
| 2010/0164346 A1* | 7/2010 | Li | F21S 10/02 313/46 |
| 2014/0231837 A1* | 8/2014 | Singer | F21S 41/151 257/88 |
| 2016/0341395 A1* | 11/2016 | Kiyota | G02B 3/0056 |
| 2017/0336703 A1* | 11/2017 | Takagi | F21V 23/06 |
| 2017/0338628 A1 | 11/2017 | Matsushita et al. | |
| 2019/0368685 A1* | 12/2019 | Miura | F21V 13/04 |
| 2020/0303594 A1* | 9/2020 | Sorg | H01S 5/02257 |

FOREIGN PATENT DOCUMENTS

| | | | | |
|---|---|---|---|---|
| CN | 108352436 A | * | 7/2018 | ......... H01L 25/0753 |
| CN | 109273413 A | * | 1/2019 | ............. H01L 21/48 |
| JP | 2017-208484 A | | 11/2017 | |

* cited by examiner

*Primary Examiner* — Christopher M Raabe
(74) *Attorney, Agent, or Firm* — Foley & Lardner LLP

(57) ABSTRACT

A light emission device includes: a base part; one or more semiconductor laser devices disposed on an upper surface of the base part; a frame body having a flat region that is above the lower surface of the base part and outside a region in which the one or more semiconductor laser devices are disposed, the frame body having a throughhole that extends from an upper surface to a lower surface of the flat region; an electrical conduction member disposed on a lower surface side of the flat region, the electrical conduction member including on an upper surface thereof a first conductive region and an insulative region, such that the first conductive region and the insulative region are located in a region defined by the throughhole of the frame body in a top plan view; and wiring having an end that is bonded to the first conductive region.

12 Claims, 10 Drawing Sheets

LIGHT EMISSION DEVICE

CROSS REFERENCE TO RELATED APPLICATION

This application claims priority to Japanese Patent Application No. 2019-167474, filed on Sep. 13, 2019, the entire contents of which are incorporated herein by reference.

BACKGROUND

The present disclosure relates to a light emission device.

Various light emission devices in which semiconductor laser devices are included as light sources have been proposed. For example, in a light emission device disclosed in Japanese Patent Publication No. 2017-208484, a frame body is bonded to an upper surface of a base part so as to surround semiconductor laser devices. The frame body has throughholes in its side walls. Lead terminals that are inserted in the throughholes are electrically connected to the semiconductor laser devices.

SUMMARY

According to certain embodiment of the present disclosure, electrical conduction of light-emitting elements in a light emission device is achieved through a novel method that is distinct from methods that involves inserting lead terminals in throughholes.

In one embodiment of the present disclosure, a light emission device includes: a base part having an upper surface and a lower surface; one or more semiconductor laser devices disposed on the upper surface of the base part; a frame body having a flat region that is above the lower surface of the base part and outside a region in which the one or more semiconductor laser devices are disposed, the flat region extending in a lateral direction, and the frame body having in the flat region a throughhole that extends from an upper surface to a lower surface of the flat region; an electrical conduction member disposed on the lower surface side of the flat region, the electrical conduction member including on an upper surface thereof a first conductive region and an insulative region, such that the first conductive region and the insulative region are contained in a penetrated region defined by the throughhole of the frame body in a top plan view; and wiring bonded at one end to the first conductive region of the electrical conduction member in order to electrically connect the one or more semiconductor laser devices.

According to certain embodiments of the present disclosure, there is provided a light emission device in which electrical conduction is achieved by providing an electrical conduction member on the lower surface side of a frame body.

DETAILED DESCRIPTION

Figure 1A:
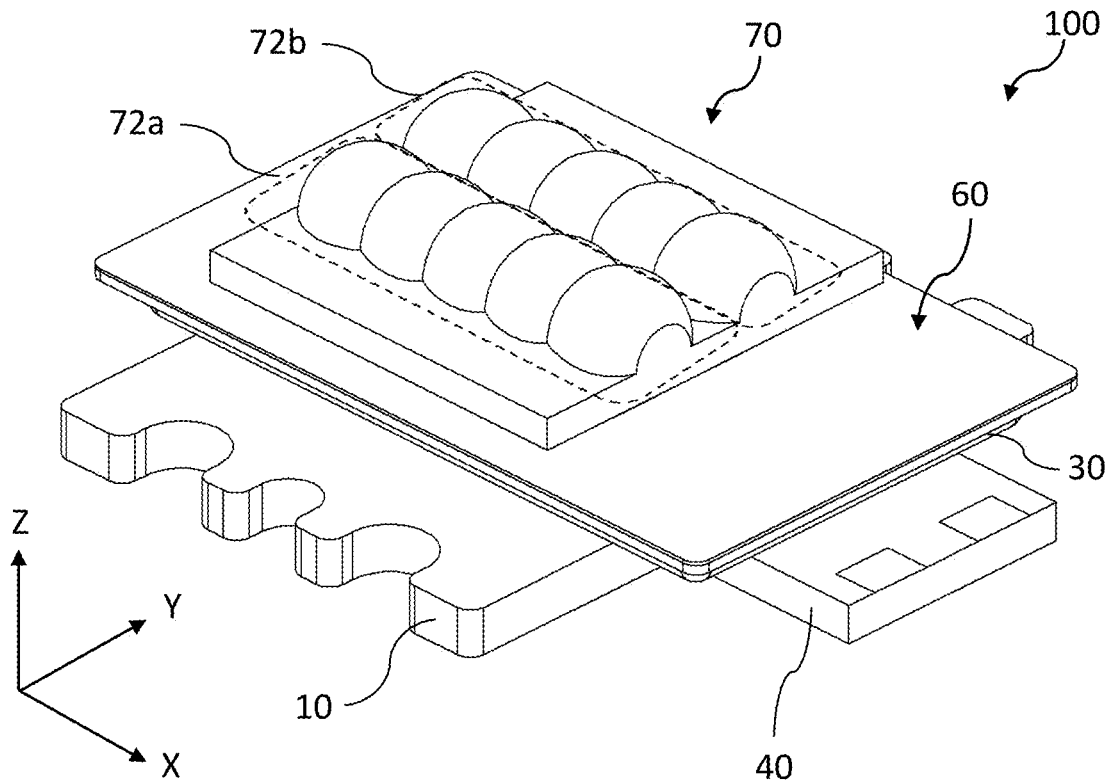
FIG. 1A is a perspective view schematically showing a light emission device according to an illustrative embodiment of the present disclosure.

Hereinafter, with reference to the drawings, light emission devices according to embodiments of the present disclosure will be described in detail. Any component appearing in more than one drawing that is indicated by an identical numeral is meant to be an identical portion or member.

The following disclosure is intended to exemplify the technical ideas of the present invention, and the present invention is not limited to the embodiments described below. The size, material, shape, and relative disposition of the constituent components are intended as examples, and are not intended to limit the scope of the present invention. The size, positional relationship and the like of the members in the drawings may be exaggerated for the sake of easier understanding.

Embodiments

First, with reference to FIGS. 1A through 1C, an example configuration of a light emission device according to an embodiment of the present disclosure will be described.

Figure 1B:
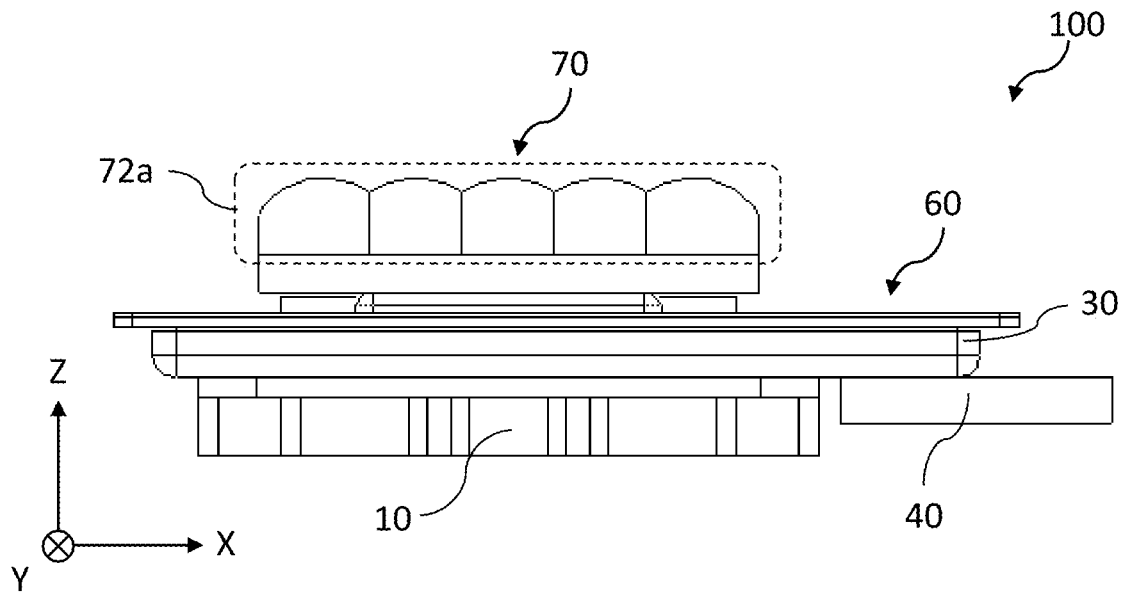
FIG. 1B is a side view schematically showing a light emission device according to an illustrative embodiment of the present disclosure.

FIG. 1A and FIG. 1B are a perspective view and a side view, respectively, schematically showing a light emission device 100 according to an illustrative embodiment of the present disclosure. FIG. 1C shows component elements of the light emission device 100 as separated from one another, for ease of explanation. For reference sake, each drawing shows an X direction, a Y direction, and a Z direction that are orthogonal to one another. In the present specification, for ease of understanding, the position direction along the Z axis will be referred to as "upward", "above", etc. This does not limit the orientation of the light emission device 100 during use; the orientation of the light emission device 100 may be appropriately selected. Moreover, the positive direction and the negative direction will be denoted as the "+" direction and the "−" direction, respectively. For example, regarding the X direction, the positive direction will be referred to as the "+X direction", and the negative direction as the "−X direction". Note that the + direction on each given axis corresponds to the direction of an arrowhead shown for that axis in the drawing, whereas the − direction corresponds to an opposite direction to the arrowhead.

The light emission device 100 includes: a base part 10 on which semiconductor laser devices are supported; a frame body 30 surrounding the semiconductor laser devices supported by the base part 10; a lid 60 fixed to the frame body 30; and an optical member 70 attached onto the lid 60. The base part 10 and the lid 60 each have a plate shape as illustrated. FIGS. 1A through 1C are illustrated so that the thickness direction of the plate shape corresponds to the Z direction.

Furthermore, the light emission devices 100 includes an electrical conduction member 40 for supplying external power to the semiconductor laser devices on the base part 10. The structure and function of the electrical conduction member 40 will be described in detail below. The electrical conduction member 40 enables electrical connection with the semiconductor laser devices.

The light emission device 100 includes a plurality of semiconductor laser devices. In the light emission device 100, the plurality of semiconductor laser devices are disposed so that each row includes more laser devices than does each column. Specifically, the semiconductor laser devices supported by the base part 10 include: first semiconductor laser devices 20a constituting a first row, which includes 5 columns; and second semiconductor laser devices 20b constituting a second row, which includes 5 columns. Each row is parallel to the longitudinal direction (the X direction) of the light emission device 100. Note that the numbers and arrangements of the first semiconductor laser devices 20a and the second semiconductor laser devices 20b are not limited to this example, but may be appropriately selected. It suffices if one or more semiconductor laser devices are included in the light emission device 100.

A frame body 30 is provided around the first semiconductor laser devices 20a and the second semiconductor laser devices 20b, which are disposed on the base part 10. The frame body 30 is fixed to the base part 10. Moreover, the frame body 30 includes a flat region 32 extending in one lateral direction (e.g., the +X direction). A throughhole 34 is made in the flat region 32 in order to achieve electrical connection between the first semiconductor laser devices 20a and second semiconductor laser devices 20b and the electrical conduction member 40.

The electrical conduction member 40, which is located below the flat region 32, is bonded to a lower surface of the frame body 30 in its flat region 32. The electrical conduction member 40 is exposed in the throughhole 34 made in the flat region 32. By utilizing this exposed portion, the first semiconductor laser devices 20a and the second semiconductor laser devices 20b can be electrically connected to an external circuit.

With a light emission device according to the present embodiment, electrical conduction can be achieved without requiring any lead terminals.

Hereinafter, the specific configuration of the light emission device 100 will be described in more detail. FIG. 2A is a perspective view schematically showing the positioning of the first semiconductor laser devices 20a and second semiconductor laser devices 20b, as well as first light-reflective members 22a and second light-reflective members 22b, on an upper surface 10s1 of the base part 10. FIG. 2B is a plan view schematically showing the light emission device 100 of FIG. 1C, in which the lid 60 and the optical member 70 are omitted from illustration, and FIG. 2C is a cross-sectional view thereof taken along the XZ plane. FIG. 2D is a perspective view schematically showing an example of the electrical conduction member 40. FIG. 2E is a cross-sectional view of the light emission device 100 of FIG. 1A as taken along the YZ plane. FIG. 2A shows a state before wiring lines 50 (described later) are bonded. Regions shown grayed in FIG. 2E represent how laser light that is emitted from the first semiconductor laser devices 20a and the second semiconductor laser devices 20b may travel.

As shown in FIG. 2A, the base part 10 includes the upper surface 10s1 and a lower surface 10s2, which are parallel to the XY plane, and has a thickness along the Z direction. The first semiconductor laser devices 20a and the second semiconductor laser devices 20b are disposed on the upper surface 10s1 of the base part 10. Each first semiconductor laser device 20a or each second semiconductor laser device 20b emits laser light toward, respectively, a corresponding one of the first light-reflective members 22a or a corresponding one of the second light-reflective members 22b.

Regarding the Y direction, the first light-reflective members 22a and the second light-reflective members 22b are interposed between the first semiconductor laser devices 20a and the second semiconductor laser devices 20b. Light-emission end surfaces of the first semiconductor laser devices 20a and light-emission end surfaces of the second semiconductor laser devices 20b face each other, in a manner of being oriented inward in the light emission device 100. A first reflective surface 22as that is provided on a slope of each first light-reflective member 22a reflects laser light that is emitted from the first semiconductor laser device 20a, whereas a second reflective surface 22bs that is provided on a slope of each second light-reflective member 22b reflects laser light that is emitted from the second semiconductor laser device 20b. The reflected laser light is incident on the optical member 70 via a light-transmissive member 62, which is included in the lid 60 shown in FIG. 1C. The optical member 70 collimates the incident laser light for output.

In the light emission device 100, the light-reflective members and the semiconductor laser devices are disposed with a one-to-one correspondence between them. A distance between the light-emission end surface of a first semiconductor laser device 20a to a first reflective surface 22as of a corresponding first light-reflective member 22a (hereinafter referred to as a first gap) is equal among all first semiconductor laser devices 20a. A distance between the light-emission end surface of a second semiconductor laser device 20b to a second reflective surface 22bs of a corresponding second light-reflective member 22b (hereinafter referred to as a second gap) is equal among all second semiconductor laser devices 20b. Moreover, the first gap and the second gap are equal. Note that being equal, as used herein of gaps, admits of a difference within 20 μm. Note that these values may not even be equal.

The angle made by the first reflective surface 22as and the upper surface 10s1 and the angle made by the second reflective surface 22bs and the upper surface 10s1 are equal. As used herein, being equal admits of a difference within 3 degrees. Note that these angles may not even be equal. In the example shown in FIG. 2A, each angle is 45 degrees; however, each angle may alternatively have any value other than 45 degrees.

Laser light that is emitted in the +Y direction from each first semiconductor laser device 20a is reflected in the +Z direction by the first reflective surface 22as. Laser light that is emitted in the −Y direction from each second semiconductor laser device 20b is reflected in the +Z direction by the second reflective surface 22bs. Note that, without providing the first light-reflective members 22a and the second light-reflective members 22b, the light emission device 100 may alternatively be configured so that laser light is emitted in the +Z direction from each first semiconductor laser device 20a and from each second semiconductor laser device 20b.

The flat region 32 of the frame body 30 is a planar region that extends in a lateral direction, outside the region in which the semiconductor laser devices are disposed. Moreover, in the light emission device 100, the flat region 32 is a planar region that is disposed outside the region where the semiconductor laser devices are disposed and that is parallel to the upper surface 10s1 of the base part 10. Furthermore, the flat region 32 is located in the +X direction of the positions at which the semiconductor laser devices are disposed. The flat region 32 extends along the row direction in the arrangement of the semiconductor laser devices, i.e., the direction (row direction) along which the first semiconductor laser devices 20a or the second semiconductor laser devices 20b are arranged. The flat region 32 extends along a longitudinal direction of a frame that is created by the frame body 30.

The throughhole 34 in the frame body 30 is an aperture that extends through the frame body 30 from an upper surface 32s1 to a lower surface 32s2 thereof, in the flat region 32. In the example shown in FIG. 2B, there is one throughhole 34. The throughhole 34 is sized smaller than an upper surface 40s1 of the electrical conduction member 40. Because electrical conduction is achieved through one throughhole 34, it is easy to design the frame body 30. The height from the lower surface 10s2 of the base part 10 to the lower surface 32s2 of the frame body 30 is preferably equal to or greater than the thickness (i.e., length along the top-bottom direction) of the electrical conduction member 40, so that the light emission device 100 can be easily mounted on a flat mounting substrate.

As shown in FIG. 2D, the electrical conduction member includes two first conductive regions 42a and two second conductive regions 42b on the upper surface 40s1. Any two among these conductive regions are spaced apart from each other via an insulative region. Moreover, one first conductive region 42a and one second conductive region 42b compose a pair that are coupled and electrically connected via wiring lines passing inside the electrical conduction member 40, there being two such pairs.

Note that the number and positioning of first conductive regions 42a and second conductive regions 42b are not limited to this example. While the first conductive regions 42a may be provided on the upper surface 40s1, the second conductive regions 42b may be provided on the upper surface 40s1, the lower surface 40s2, or at least one of the side surfaces 40s3, for example. In other words, the first conductive regions 42a and the second conductive regions 42b may be provided on the same surface, or on different surfaces.

In the flat region 32, the electrical conduction member 40 is disposed at the lower surface 32s2 side of the frame body 30. Specifically, the upper surface 40s1 of the electrical conduction member 40 and the lower surface 32s2 of the frame body 30 are bonded to each other. Moreover, in a top plan view, the upper surface 40s1 of the electrical conduction member 40 extends outward of the region (upper surface 32s1) in which the flat region 32 of the frame body 30 is contained. Note that, as shown in FIG. 2B, the electrical conduction member 40 is disposed so that, in a top plan view, the first conductive regions 42a are exposed in a penetrated region 46 that is defined by the throughhole 34. Moreover, an insulative region 44 is exposed through the penetrated region 46, such that the first conductive regions 42a are surrounded by the insulative region 44.

The second conductive regions 42b are not exposed in the penetrated region 46 in a top plan view. However, the second conductive regions 42b are disposed so as to be exposed in a region other than the penetrated region 46. Moreover, it is desirable that the second conductive regions 42b do not overlap the flat region 32 (the upper surface 32s1) of the frame body 30 in a top plan view. This prevents, in the case where the frame body 30 is made of a metal, electrical conduction from the second conductive regions 42b to the frame body 30. In the example shown in FIG. 2B and FIG. 2C, at the upper surface 40s1 of the electrical conduction member 40, the second conductive regions 42b are located in a region extending outward of the flat region 32 of the frame body 30. Moreover, in a top plan view, the second conductive regions 42b are located in a region extending outward of the outer shape of the frame body 30. This permits, without being obstructed by the frame body 30, electrical conduction of the second conductive regions 42b provided on the upper surface 40s1 of the electrical conduction member 40.

Via the plurality of wiring lines 50, the plurality of first semiconductor laser devices 20a and the plurality of second semiconductor laser devices 20b are electrically connected to the two first conductive regions 42a. As shown in FIG. 2B, in the light emission device 100, wiring lines 50 are connected from one first conductive region 42a to the first semiconductor laser devices 20a, the second semiconductor laser devices 20b, and to the other first conductive region 42a. This allows the first semiconductor laser devices 20a and the second semiconductor laser devices 20b to be connected in series altogether, so that power can be supplied to the first semiconductor laser devices 20a and the second semiconductor laser devices 20b.

In the example shown in FIG. 2B, first relay members 52a and second relay members 52b are also employed for electrical connection. The first relay members 52a assist in the connection from the semiconductor laser devices to the first conductive regions 42a. One first relay member 52a corresponds to one first conductive region 42a. This allows the length of one wiring line 50 to be shorter than in the case where the wiring lines 50 are directly connected; therefore, this allows for more stable connection when there is a long distance from the semiconductor laser devices to each first conductive region 42a. The second relay members 52b assist in the connection from the first semiconductor laser devices 20a to the second semiconductor laser devices 20b. In other words, from the first semiconductor laser devices 20a to the second semiconductor laser devices 20b, the wiring lines 50 are connected not directly, but via the second relay members 52b. In this manner, the wiring lines 50 can be connected without obstructing the optical path.

The lid 60 is bonded to an upper surface of the frame body 30. This bonding surface of the frame body 30 with the lid 60 is located above the upper surface 32s1, which includes the flat region 32. Moreover, the bonding surface of the frame body 30 and the upper surface 32s1 are mutually stepped. In the example shown in FIG. 13, the lid 60 is bonded to the uppermost surface of the frame body 30.

In the light emission device 100, the inside of the light emission device 100 is hermetically sealed by the base part 10, the frame body 30, the electrical conduction member 40, and the lid 60. This hermetic sealing can reduce influences of dust collection associated with laser light.

The respective bonding surfaces of the lid 60 and the frame body 30 at which they are bonded together are located above the upper surface 32s1 in the flat region 32 shown in FIG. 2C. As shown in FIG. 1C, the lid 60 includes not only the light-transmissive member 62 but also a supporting member 64 supporting the light-transmissive member 62. An opening is made in the supporting member 64. In a top plan view, the opening entirely contains the first reflective surfaces 22as of the first light-reflective members 22a and the second reflective surfaces 22bs of the second light-reflective members 22b. Also in a top plan view, the opening contains all of the first light-reflective members 22a and the second light-reflective members 22b. However, in a top plan view, the opening does not contain the throughhole 34. The supporting member 64 supports the light-transmissive member 62 at the peripheral portion of the opening. In other words, the light-transmissive member 62 closes the opening of the supporting member 64. As shown in FIG. 2E, light that is emitted from the first semiconductor laser devices 20a and the second semiconductor laser devices 20b passes through the light-transmissive member 62.

The optical member 70 is supported by the lid 60. The optical member 70 includes: in the first row, a first lens part 72a including five lenses; and in the second row, a second lens part 72b including five lenses. Note that the numbers and arrangement of lenses are not limited to this example, but may be appropriately selected. The optical member 70 may at least include one or more lenses. In the example shown in FIG. 1C, the lenses of the first lens part 72a are located so as to overlap the respective first reflective surfaces 22as in a top plan view, such that laser light that is emitted from the first semiconductor laser devices 20a and reflected by the first reflective surfaces 22as passes through these lenses. The same is also true of the relative positioning between the lenses of the second lens part 72b and the second reflective surface 22bs. The optical member 70 may additionally include a lens part(s) other than the first lens part 72a and the second lens part 72b.

As shown in FIG. 2E, the lenses exert optical control on the emission of the laser light that has entered at the lower surface of the optical member 70. The optical control may involve: collimating the laser light into parallel light and allowing this parallel light to be emitted from the upper surface of the optical member 70. Note that, depending on the intended use, the optical control is not limited to collimation. The lenses may converge or diverge the laser light being incident on the lower surface of the optical member 70, and allow the light to be emitted from the upper surface of the optical member 70.

Hereinafter, the configuration of the light emission device 100 according to the present embodiment will be described in more detail.

Base Part 10

The base part 10 may desirably be formed of a material having a relatively high thermal conductivity, so as to quickly release the heat generated by the first semiconductor laser devices 20a and the second semiconductor laser devices 20b to the outside. The thermal conductivity of the base part 10 may be e.g. 20 W/mK or more. Examples of such materials include metals such as Cu, Al, Fe, Ni, Mo, Cu and W, and CuMo. At least a portion of the upper surface 10s1 of the base part 10 may be plated with Au, Ag, Al, or the like. In one example, the upper surface 10s1 of a base part 10 formed of copper (Cu) or a copper alloy may be gold-plated.

The shape and size of the base part 10 may be adjusted as appropriate, according to the desired shape and size of the light emission device 100. The base part 10 may have, for example, one planar shape selected from the group consisting of a quadrangle, a polygon, a circle, an oval, and any similar shape. Moreover, for example, the base part 10 may have a planar shape whose longest dimension is not less than 5 mm and not more than 50 mm, and whose thickness (length along the Z direction) is not less than 0.5 mm and not more than 5 mm.

In the light emission device 100, the base part 10 may have a convex shape whose thickness is locally increased in the region where the semiconductor laser devices are disposed. As the number of semiconductor laser devices to be disposed in the base part 10 increases, the footprint of the semiconductor laser devices will increase. If the base part 10 is too thin, the accuracy of mounting may be degraded due to warping; a sufficient thickness of the base part 10 will allow the semiconductor laser devices to be disposed on a flat surface. Adopting a convex shape will allow the frame body 30 to be bonded to the base part 10 at a surface that is situated lower than the surface on which the semiconductor laser devices are disposed, whereby the height of the light emission device 100 can be reduced. For example, in the illustrated configuration of the light emission device 100, a base part 10 having a convex shape may be adopted when the number of semiconductor laser devices exceeds sixteen (i.e., 2 rows by 8 columns). Note that screwholes may be provided outside the region of the base part 10 where the frame body 30 is disposed, and that the edge shape of the base part 10 may be partly modified in order to allow the light emission device 100 to be provided on another device.

First Semiconductor Laser Devices 20a and Second Semiconductor Laser Devices 20b The first semiconductor laser devices 20a and the second semiconductor laser devices 20b are provided on the upper surface 10s1. The center-to-center distance between any two adjacent ones among the plurality of first semiconductor laser devices 20a, and the center-to-center distance between any two adjacent ones among the plurality of second semiconductor laser devices 20b, may each be e.g. 0.85 mm or more. This can reduce the mutual influences of heat generated by the laser devices. On the other hand, from a standpoint of downsizing the light emission device 100, the center-to-center distance may preferably be 2.5 mm or less, for example.

As shown in FIG. 2A, the light emission device 100 further includes: a first submount 24a that is located between each first semiconductor laser device 20a and the upper surface 10s1; and a second submount 24b that is located between each second semiconductor laser device 20b and the upper surface 10s1. In other words, the first semiconductor laser devices 20a are provided on the first submounts 24a, which in turn are provided on the upper surface 10s1, whereas the second semiconductor laser devices 20b are provided on the second submounts 24b, which in turn are provided on the upper surface 10s1. A first Zener diode 26a is provided on each first submount 24a, whereas a second Zener diode 26b is provided on each second submount 24b. The first Zener diodes 26a and the second Zener diodes 26b can protect the first semiconductor laser devices 20a and the second semiconductor laser devices 20b from surge currents or static electricity. Depending on the intended use, the first Zener diodes 26a and the second Zener diodes 26b may or may not be provided.

By forming the first submounts 24a and the second submounts 24b with a material having high thermal conductivity, heat that is emitted from the first semiconductor laser devices 20a and the second semiconductor laser devices 20b can be efficiently released to the outside. Examples of such materials of high thermal conductivity include AlN, CuW, diamond, and SiC. In order to bond the first semiconductor laser devices 20a and the second semiconductor laser devices 20b, a thin film of metals, e.g., Ti/Pt/Au or Ni/Au, is formed on the surface of each first submount 24a and each second submount 24b.

In the light emission device 100, a submount is separately provided for each individual semiconductor laser device; this facilitates adjustment in the positioning of the plurality of first semiconductor laser devices 20a and the plurality of second semiconductor laser devices 20b when they become mounted. Note that a plurality of first semiconductor laser devices 20a may be provided on a single first submount 24a. The same is also true of the second semiconductor laser devices 20b.

The semiconductor laser devices (the first semiconductor laser devices 20a and the second semiconductor laser devices 20b) and the base part 10 are bonded by a bonding material such as AuSn, Au, or Ag, for example. In the case where submounts (first submounts 24a and second submounts 24b) are employed, the submounts and the base part 10 are bonded by at least one material that is selected from the aforementioned group of bonding materials. Because the bonding temperature is about 200° C. to about 300° C., damage to the semiconductor laser devices associated with heat will not be a large problem. This bonding is to be performed after the bonding between the base part 10 and the frame body 30 (described below) and the bonding between the frame body 30 and the electrical conduction member 40, for reasons as follows. The bonding temperature during the bonding between the base part 10 and the frame body 30 and the bonding temperature during the bonding between the frame body 30 and the electrical conduction member 40 are higher than the bonding temperature during the bonding between the semiconductor laser devices and the base part 10. Therefore, if the bonding between the semiconductor laser devices and the base part 10 is performed first, the semiconductor laser devices may become separated from the base part 10 during the bonding between the base part 10 and the frame body 30, or during the bonding between the frame body 30 and the electrical conduction member 40.

Next, the configuration of the semiconductor laser devices (the first semiconductor laser devices 20a and the second semiconductor laser devices 20b) will be described. Each semiconductor laser device is structured so that, for example, an n-type semiconductor layer, an active layer, and a p-type semiconductor layer are layered in this order in the Z direction. Each semiconductor laser device further includes an electrode located on the n-type semiconductor layer side, and an electrode located on the p-type semiconductor layer side. In the present specification, the electrode on the n-type semiconductor layer side is referred to as the "n-side electrode", and the electrode on the p-type semiconductor layer side is referred to as the "p-side electrode". By applying voltage to the n-side electrode and the p-side electrode and causing a current equal to or greater than a threshold value to flow, laser light is emitted in a direction parallel to the Y direction from an end surface of the active layer. The spot of the emitted laser light has an oval shape whose major axis is in the Z direction and whose minor axis is in the X direction in the far field. The semiconductor contained in the semiconductor laser devices is not limited; for example, an arsenide semiconductor such as GaAs, or a nitride semiconductor such as GaN may be used. The semiconductor laser devices can emit laser light of a long wavelength, a mid-wavelength, or a short wavelength in the visible region. Laser light of a long wavelength may be e.g. red laser light; laser light of a mid-wavelength may be e.g. green laser light; and laser light of a short wavelength may be e.g. blue laser light. Depending on the intended use, the semiconductor laser devices may emit infrared laser light, or ultraviolet laser light. The plurality of first semiconductor laser devices 20a and the plurality of second semiconductor laser devices 20b in FIG. 2A may all emit laser light having an identical wavelength, or at least one of them may emit laser light having a different wavelength.

Light-Reflective Members 22

The first light-reflective members 22a and the second light-reflective members 22b are provided on the upper surface 10s1. Note that they may be made integral with the base part 10. The light-reflective members 22 may be made of the same material as the base part 10, e.g., glass, quartz, synthetic quartz, sapphire, a ceramic, a plastic, silicon, a metal, or a dielectric material. Moreover, the first reflective surface 22as and the second reflective surface 22bs may be made of a multilayer dielectric film that is formed from a dielectric material. The structure in which the first reflective surface 22as and the second reflective surface 22bs are separately provided on the slope of each first light-reflective member 22a and the slope of each second light-reflective member 22b is only an example. Instead, the first light-reflective members 22a and the second light-reflective members 22b may themselves be made of a light-reflective material, on which the first reflective surface 22as and the second reflective surface 22bs will exhibit themselves.

Frame Body 30

The frame body 30 is provided on the upper surface 10s1. In the example shown in FIG. 2B and FIG. 2C, the frame body 30 includes: a first upper surface 30s1, a second upper surface 30s2, and a third upper surface 30s3; first side walls 30w1 that extend between the first upper surface 30s1 and the second upper surface 30s2; and second side walls 30w2 that extend between the second upper surface 30s2 and the third upper surface 30s3. Even if the base part 10 is deformed due to thermal expansion or the like, the first side walls 30w1 and the second side walls 30w2 will make it less likely for the resultant stress to be transmitted to the electrical conduction member 40 and the lid 60. As a result of this, cracking and separation of the electrical conduction member 40 and the lid 60 associated with such stress are suppressed. Moreover, the second side walls 30w2 provide a safety region that prevents any wiring lines 50 connecting to the electrical conduction member 40 from coming into contact with the lid 60. Instead of being separately provided on the base part 10, the frame body 30 may be made integral with the base part 10. In the case where the frame body 30 is separately provided on the base part 10, if the coefficient of thermal expansion of the frame body 30 is smaller than the coefficient of thermal expansion of the base part 10, stress transmitted to the electrical conduction member 40 and the lid 60 can be further reduced.

The frame body 30 may be made of an SPC (Steel Plate Cold) member, for example. The coefficient of thermal expansion of an SPC member is smaller than the coefficient of thermal expansion of any of the aforementioned materials for composing the base part 10. By forming the shape of the frame body 30 through presswork, the production cost can be reduced. An SPC member is suitable for presswork. In the example shown in FIG. 2B and FIG. 2C, the frame body 30 has a thickness of e.g. not less than 0.25 mm and not more than 0.50 mm in each of the following sections of the frame body 30: the first upper surface 30$s$1, the first side walls 30$w$1, the second upper surface 30$s$2, the second side walls 30$w$2, and the third upper surface 30$s$3. A height taken from the lower surface (which is located on the opposite side to the first upper surface 30$s$1) of the frame body 30 to the third upper surface 30$s$3 may be e.g. not less than 4.0 mm and not more than 7.0 mm.

In the example shown in FIG. 2B, in a top plan view, the first side walls 30$w$1 constitute a quadrangle frame, while the second side walls 30$w$2 also constitute another quadrangle frame. The frame constituted by the second side walls 30$w$2 is larger than the frame constituted by the first side walls 30$w$1. The space inside of the frame constituted by the first side walls 30$w$1 contains the first semiconductor laser devices 20$a$ and the second semiconductor laser devices 20$b$, but does not contain the throughhole 34 of the flat region 32. On the other hand, the space inside of the frame constituted by the second side walls 30$w$2 contains the first semiconductor laser devices 20$a$ and the second semiconductor laser devices 20$b$, and the throughhole 34 of the flat region 32 as well. Note that the shape of the frame constituted by the first side walls 30$w$1 or the frame constituted by the second side walls 30$w$2 may be, in a top plan view, a polygon, a circle, an oval, or any similar shape, for example.

The base part 10 and the frame body 30 may be bonded together by using a metal bonding member of e.g. a gold brazing material, a tin brazing material, or a silver brazing material, for example. Note that the bonding temperature associated with a silver brazing material is about 800° C., i.e., relatively high. Thus, a silver brazing material can be considered as a bonding member that is easy to use, in view of the temperature during bonding with any other bonding material or a possible increase in temperature during use of the light emission device 100.

Electrical Conduction Member 40

The electrical conduction member 40 may be composed of a piece of ceramic having a wiring line structure formed therein. The internal wiring may include a wiring line(s) layer formed among a plurality of ceramic layers and a via-conductor extending through each ceramic layer. Examples of ceramics include AlN, SiC, and aluminum oxide. Both ends of the internal wiring are in electrical conduction with the exposed first conductive regions 42$a$ and the exposed second conductive regions 42$b$. The electrical conduction member 40 may have a planar shape of a quadrangle, a polygon, a circle, or an oval, for example. In the example shown in FIG. 2D, the electrical conduction member 40 has a quadrangular planar shape each of whose sides has a length of not less than 5.0 mm and not more than 10.0 mm. Moreover, the thickness of the electrical conduction member 40 is not less than 1.0 mm and not more than 2.0 mm.

The frame body 30 and the electrical conduction member 40 may be bonded with a metal bonding member of e.g., a gold brazing material, a tin brazing material, or a silver brazing material, for example. Similarly, a silver brazing material is preferably used in the bonding between the frame body 30 and the electrical conduction member 40. In the case where the same metal bonding member is used for the bonding between the base part 10 and the frame body 30 and the bonding between the frame body 30 and the electrical conduction member 40, both bonding processes are to be performed through one unified process. If the frame body 30 is deformed with high temperature, the electrical conduction member 40 may possibly be destroyed; therefore, the frame body 30 is desirably formed of a material having a low coefficient of thermal expansion.

Wiring Lines 50

In the example shown in FIG. 2B, the wiring lines 50 are connected via wire bonding, for example. The wiring lines 50 may be made of at least one selected from the group consisting of Au, Ag, Cu, and Al, for example.

Lid 60

Figure 1C:
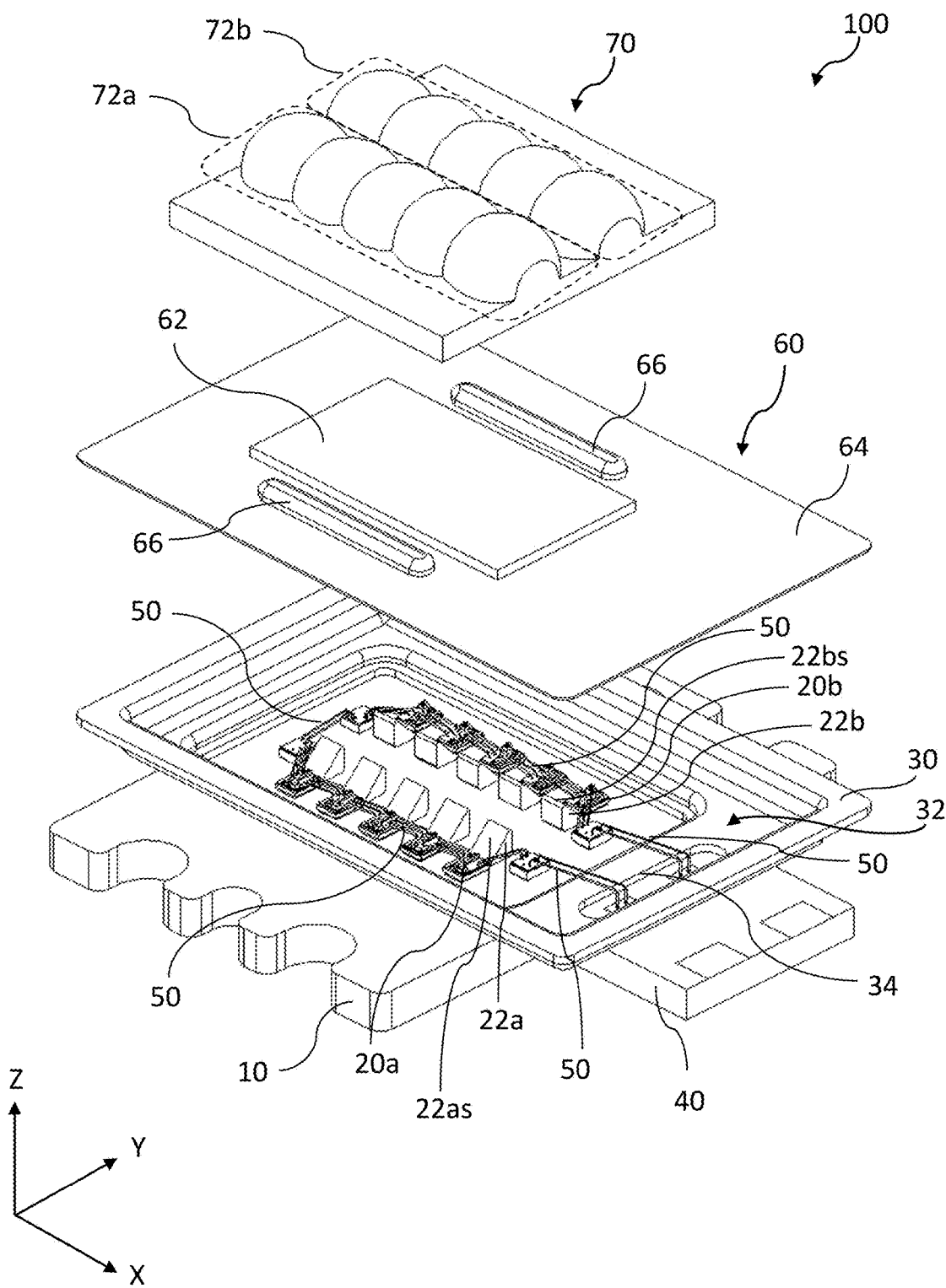
FIG. 1C is a diagram showing component elements of the light emission device as separated from one another.
Figure 2A:
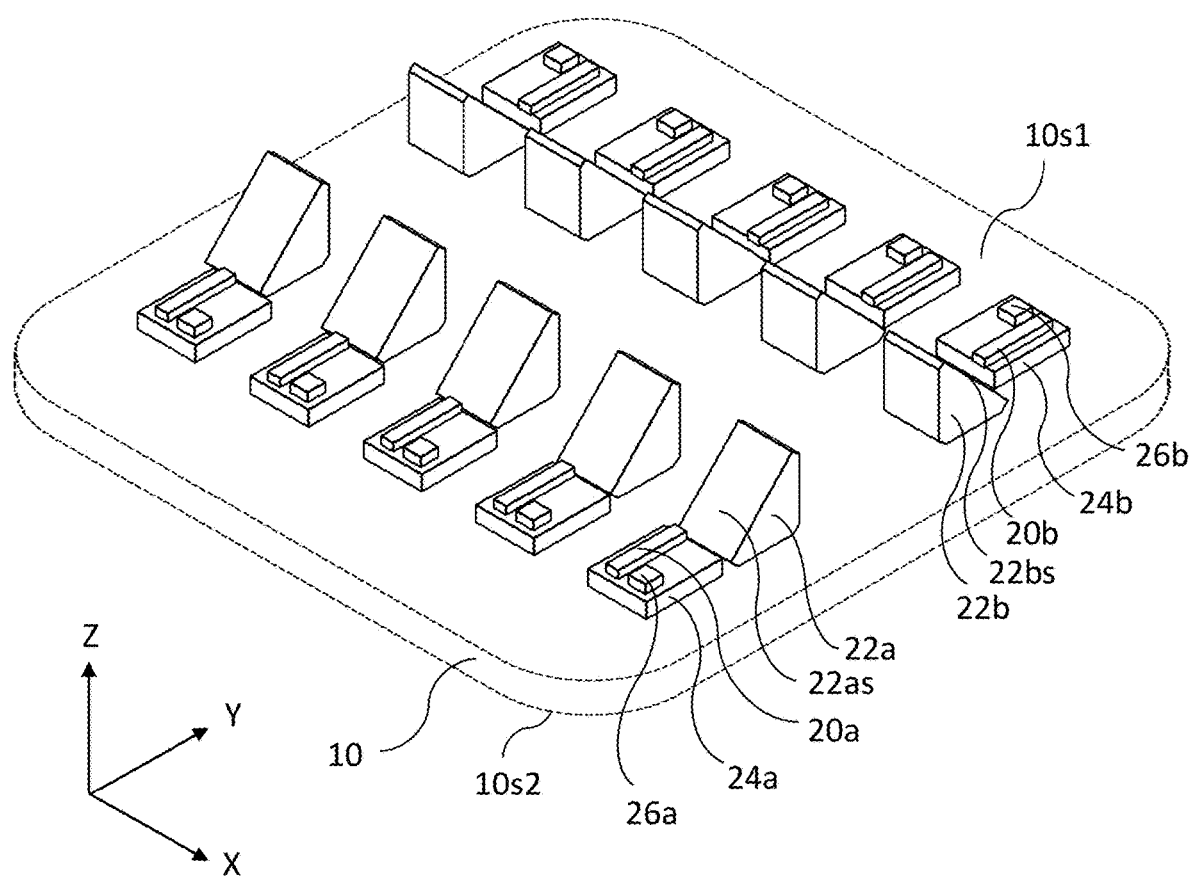
FIG. 2A is a perspective view schematically showing semiconductor laser devices and light-reflective members disposed on an upper surface of a base part.
Figure 2B:
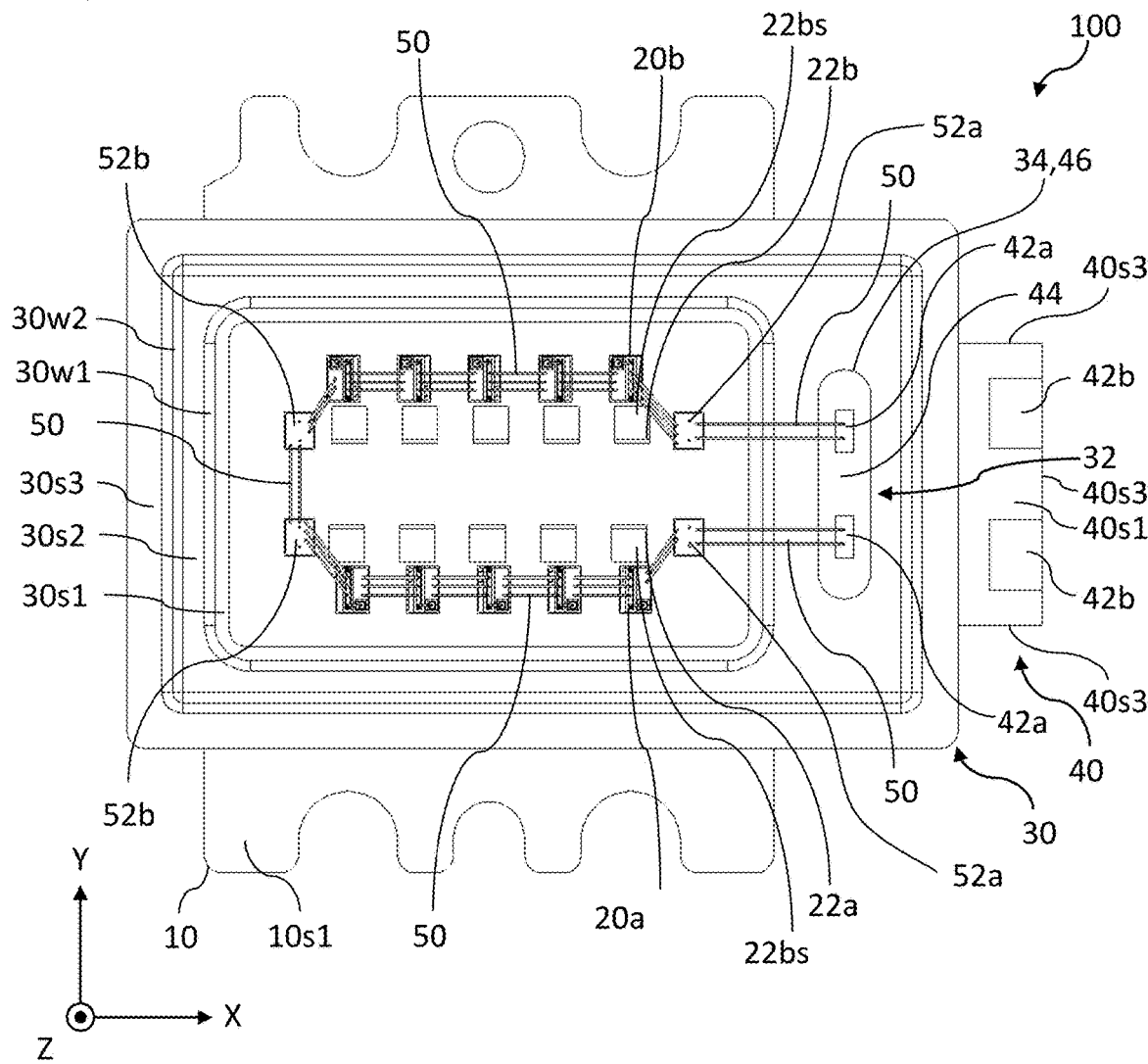
FIG. 2B is a plan view schematically showing the configuration of a light emission device, in which a lid and respective optical members are omitted from illustration.
Figure 2C:
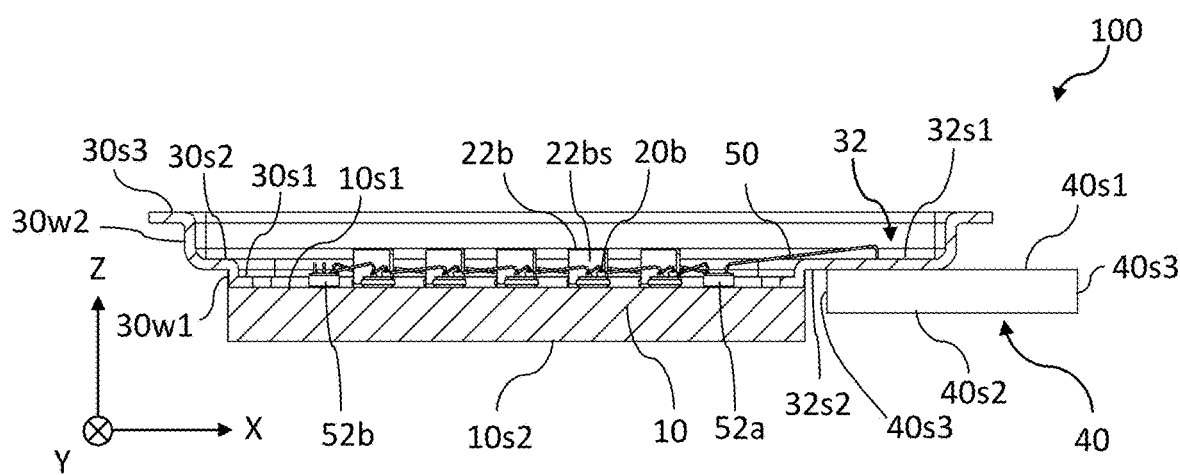
FIG. 2C is a cross-sectional view of the light emission device shown in FIG. 2B as taken along the XZ plane, in which similar elements are omitted from illustration.
Figure 2D:
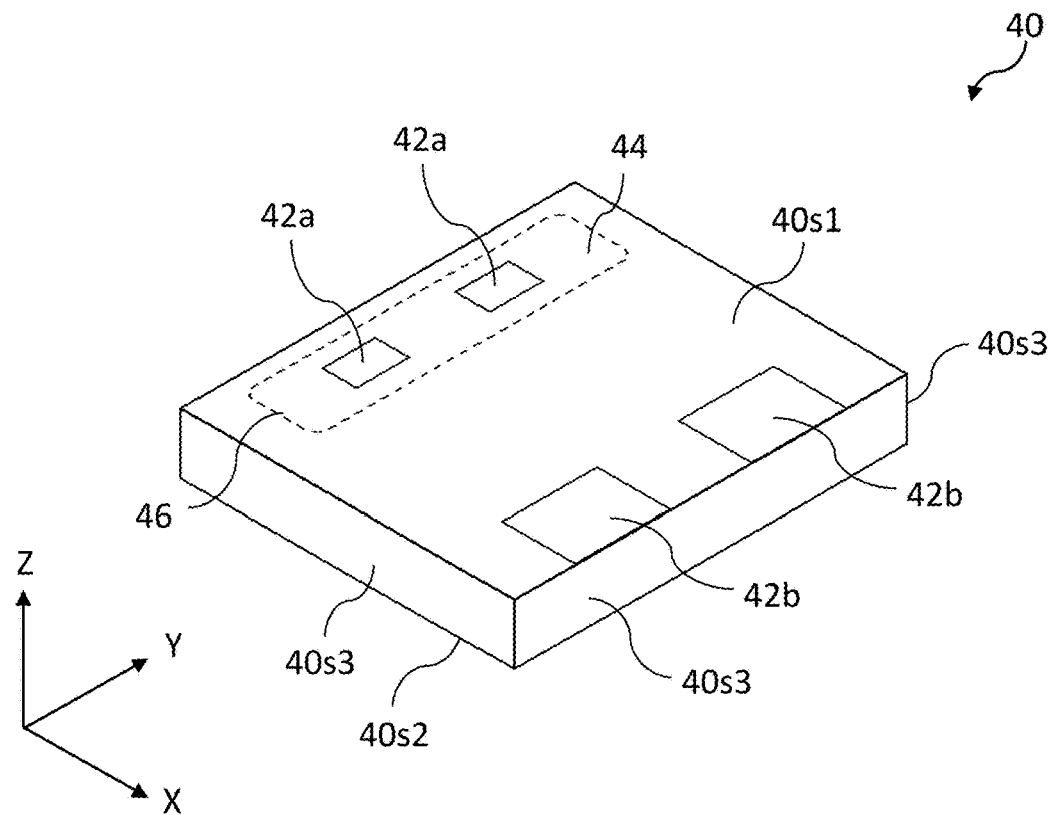
FIG. 2D is a perspective view schematically showing an example of an electrical conduction member.
Figure 2E:
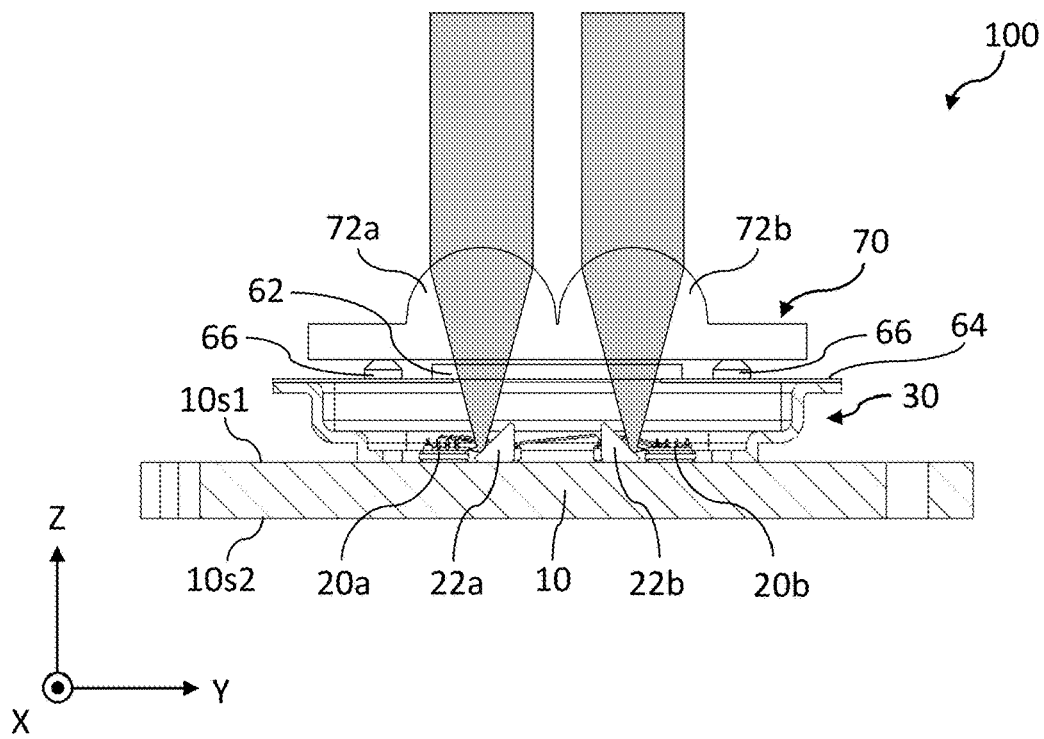
FIG. 2E is a cross-sectional view of the light emission device as taken along the YZ plane.

As shown in FIG. 1C, the supporting member 64 of the lid 60 covers the frame of the frame body 30 at a position facing the upper surface 10$s$1. The supporting member 64 of the lid 60 includes a central portion that supports the light-transmissive member 62 and a peripheral portion around it. Note that the lid 60 may entirely be composed of the light-transmissive member 62. In that case, the lid 60 does not include the supporting member 64, and therefore the light-transmissive member 62 is bonded to the frame body 30.

The supporting member 64 may be made of a metal such as Cu, Al, Fe, Au, or Ag, or an alloy thereof, for example. The frame body 30 and the supporting member 64 may be bonded by using at least one material selected from the group consisting of AuSn, NiAu, and Ag-based bonding materials, for example. This can restrain gases in the atmospheric air from becoming mixed into the light emission device 100 through the gap between the frame body 30 and the lid 60.

The light-transmissive member 62 may be made of glass, sapphire, ceramic, or the like, for example. The bonding between the light-transmissive member 62 and the supporting member 64 can be carried out by using the bonding member that was used for the bonding between the frame body 30 and the supporting member 64; alternatively, a glass bonding member such as a low-melting glass may be used. The lid 60 further includes spacers 66 to prevent contact between the light-transmissive member 62 and the optical member 70. The spacers 66 may be made integral with the supporting member 64, or be separately provided on the supporting member 64. The spacers 66 are not a requirement. The maximum thickness of the lid 60 along the Z direction may be e.g. not less than 0.05 mm and not more than 0.20 mm.

Optical Member 70

The optical member 70 may be made of glass, sapphire, a ceramic, or the like, for example. In order to collimate, converge, or diverge an oval-shaped spot of laser light, each lens may have e.g. a circle or oval shape in a top plan view. The overall thickness of the optical member 70 along the Z direction may be not less than 2.0 mm and not more than 4.0 mm, for example.

Variations

Next, variations of light emission devices according to the present disclosure will be described. In the following, any overlapping description with those given in the examples of FIGS. 1A through 1C and FIGS. 2A through 2E may be omitted.

Figure 3A:
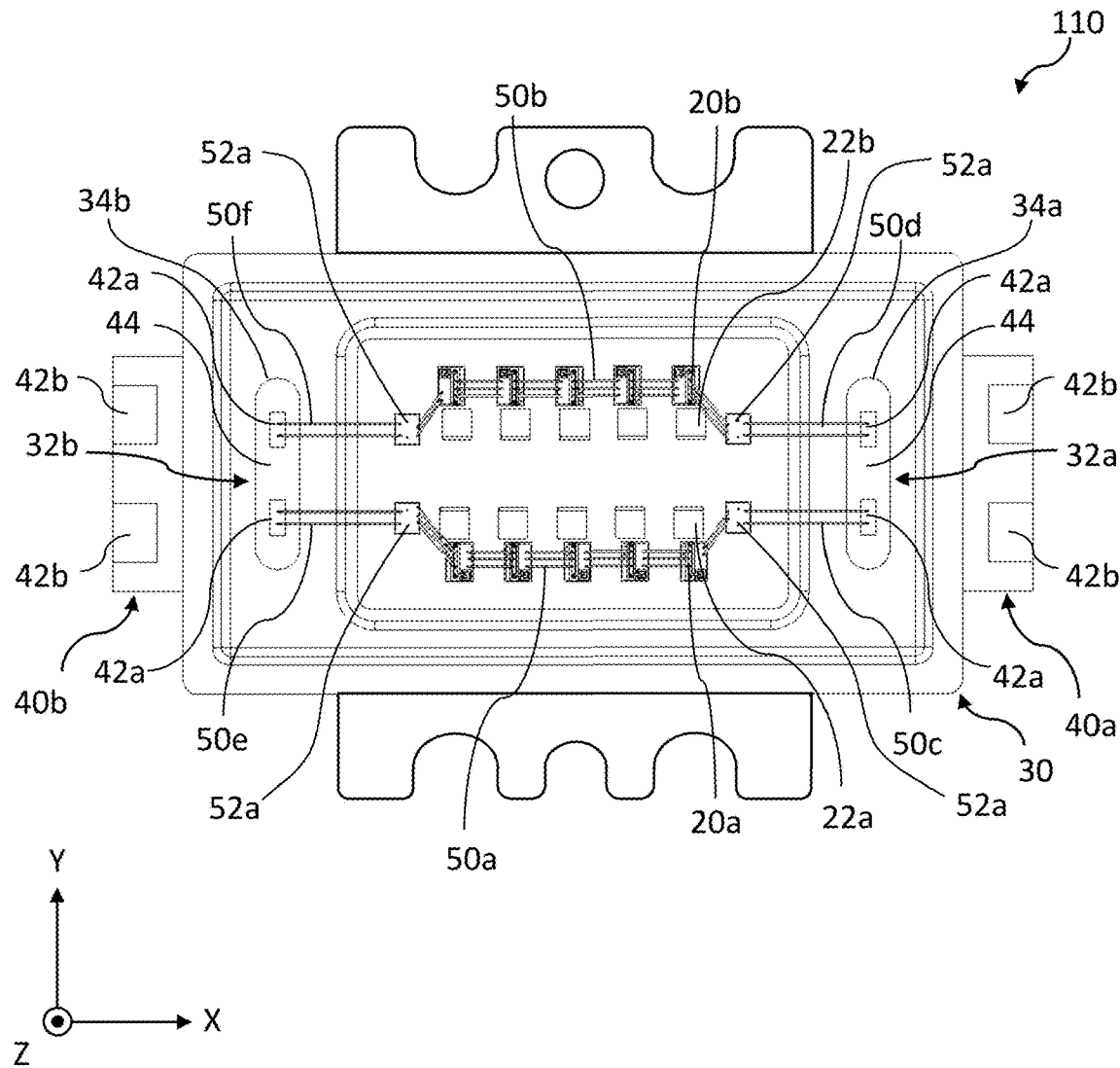
FIG. 3A is a plan view schematically showing a light emission device according to a first variation, in which a lid and an optical member are omitted from illustration.
Figure 3B:
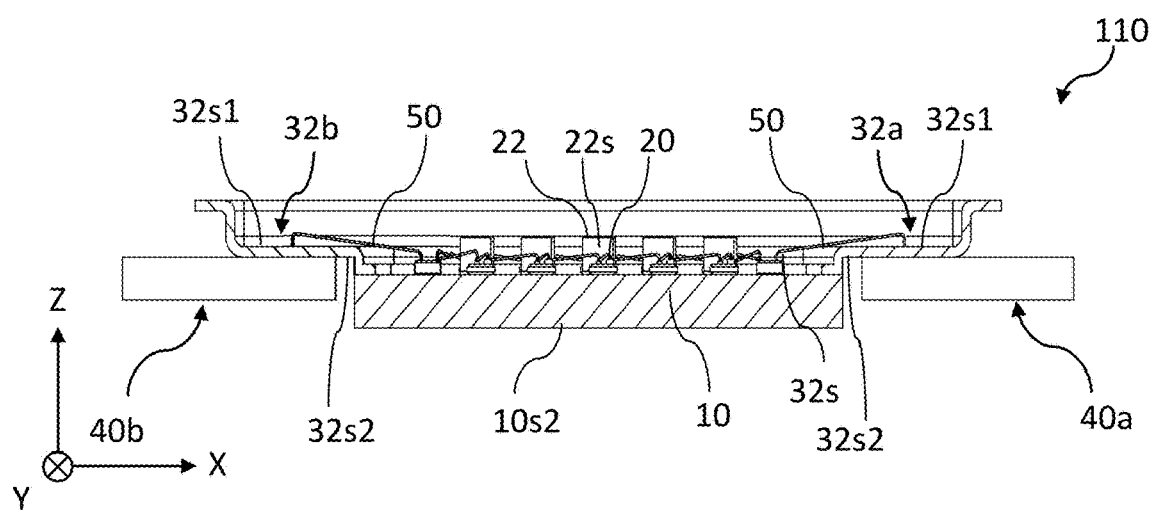
FIG. 3B is a cross-sectional view of the light emission device shown in FIG. 3A as taken along the XZ plane, in which similar elements are omitted from illustration.

With reference to FIG. 3A and FIG. 3B, an example of a light emission device that includes a plurality of electrical conduction members will be described.

FIG. 3A is a plan view schematically showing a light emission device 110 according to a first variation, in which the lid and the optical member are omitted from illustration. FIG. 3B is a cross-sectional view schematically showing the light emission device 110 according to the first variation as taken along the XZ plane, in which the lid and the optical member are omitted from illustration.

The light emission device 110 differs from the light emission device 100 with respect to the manner of wiring, and for this reason includes a plurality of electrical conduction members 40. Moreover, the frame body 30 is also shaped differently, because of the presence of the plurality of electrical conduction members 40. Otherwise, its configuration is similar to that of the light emission device 100 as described above.

As shown in FIG. 3A and FIG. 3B, the light emission device 110 includes, as the plurality of electrical conduction members 40, a first electrical conduction member 40a and a second electrical conduction member 40b. As flat regions 32 respectively corresponding to the first electrical conduction member 40a and the second electrical conduction member 40b, the frame body 30 of the light emission device 110 includes a first flat region 32a and a second flat region 32b. The first flat region 32a and the second flat region 32b are disposed above the lower surface 10s2 of the base part 10 and outside the region in which the first semiconductor laser devices 20a and the second semiconductor laser devices 20b are disposed. Moreover, the first flat region 32a and the second flat region 32b are disposed across from each other, between which the first semiconductor laser devices 20a and the second semiconductor laser devices 20b are interposed. Moreover, a first throughhole 34a and a second throughhole 34b are provided as throughholes 34 respectively corresponding to the first flat region 32a and the second flat region 32b.

As shown in FIG. 3A, the first electrical conduction member 40a is disposed so that its first conductive regions 42a are exposed in the first throughhole 34a of the first flat region 32a, whereas the second electrical conduction member 40b is disposed so that its first conductive regions 42a are exposed in the second throughhole 34b of the second flat region 32b.

In the light emission device 110 according to the first variation, the plurality of first semiconductor laser devices 20a and the plurality of second semiconductor laser devices 20b are provided in parallel wire connection on the base part 10. Electrical connection of each of the plurality of first semiconductor laser devices 20a is achieved by one of the first conductive regions 42a of the first electrical conduction member 40a and by one of the first conductive regions 42a of the second electrical conduction member 40b. Electrical connection of each of the plurality of second semiconductor laser devices 20b is achieved by the other first conductive region 42a of the first electrical conduction member 40a and by the other first conductive region 42a of the second electrical conduction member 40b.

Moreover, in the light emission device 110, first relay members 52a that assist in the connection from the semiconductor laser devices to the first conductive regions 42a are provided, in such a manner that the row of first semiconductor laser devices 20a or the row of second semiconductor laser devices 20b are interposed between each opposite pair of first relay members 52a. Meanwhile, no second relay members 52b are provided to assist in the connection from the first semiconductor laser devices 20a to the second semiconductor laser devices 20b.

Now, one of the two first conductive regions 42a of the first electrical conduction member 40a may serve as a positive electrode in the electrical conduction of the first semiconductor laser devices 20a, while the other first conductive region 42a may serve as a negative electrode in the electrical conduction of the second semiconductor laser devices 20b. In this case, one of the two first conductive regions 42a of the second electrical conduction member 40b serves as a negative electrode in the electrical conduction of the first semiconductor laser devices 20a, while the other first conductive region 42a serves as a positive electrode in the electrical conduction of the second semiconductor laser devices 20b. Alternatively, the two first conductive regions 42a of the first electrical conduction member 40a may both serve as positive electrodes, while the two first conductive regions 42a of the second electrical conduction member 40a may both serve as negative electrodes.

In the light emission device 110, supply of power to the first semiconductor laser devices 20a and supply of power to the second semiconductor laser devices 20b can be controlled separately. This can realize a light emission device in which the first semiconductor laser devices 20a and the second semiconductor laser devices 20b are independently driven to control light emission.

Next, with reference to FIG. 4A and FIG. 4B, an example of a light emission device that includes a frame body 30 that is sized smaller along the Z direction than that of the light emission device 100 in FIG. 1A will be described.

Figure 4A:
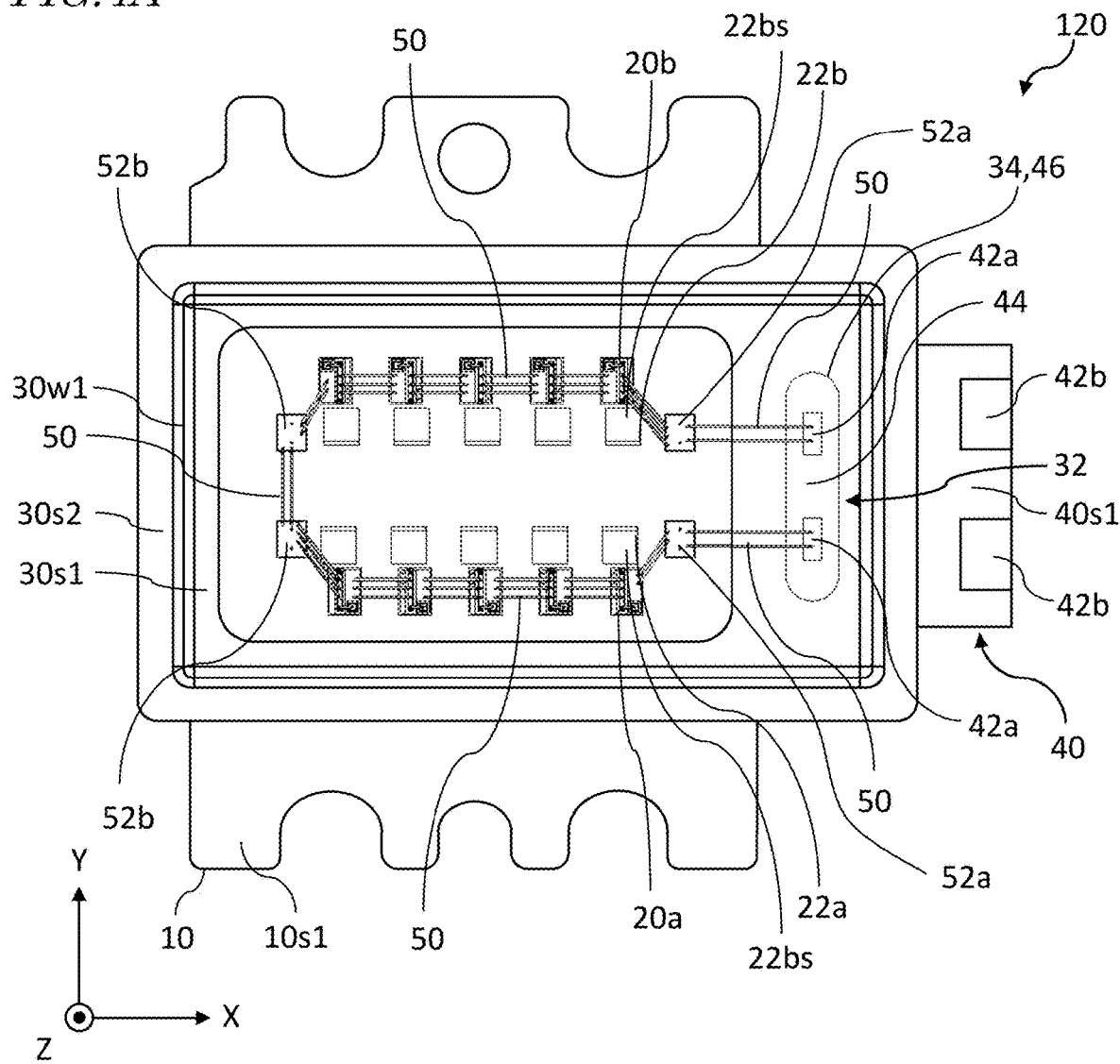
FIG. 4A is a plan view schematically showing a light emission device according to a second variation, in which a lid and an optical member are omitted from illustration.

FIG. 4A is a plan view schematically showing a light emission device 120 according to a second variation. FIG. 4B is a cross-sectional view schematically showing the light emission device 120 according to the second variation as taken along the XZ plane. In the example of the light emission device 120 shown in FIG. 4A and FIG. 4B, the lid 60 and the optical member 70 are omitted from illustration. All component elements of the light emission device 120 but the frame body 30 are as illustrated in the foregoing description of the light emission device 100.

Figure 4B:
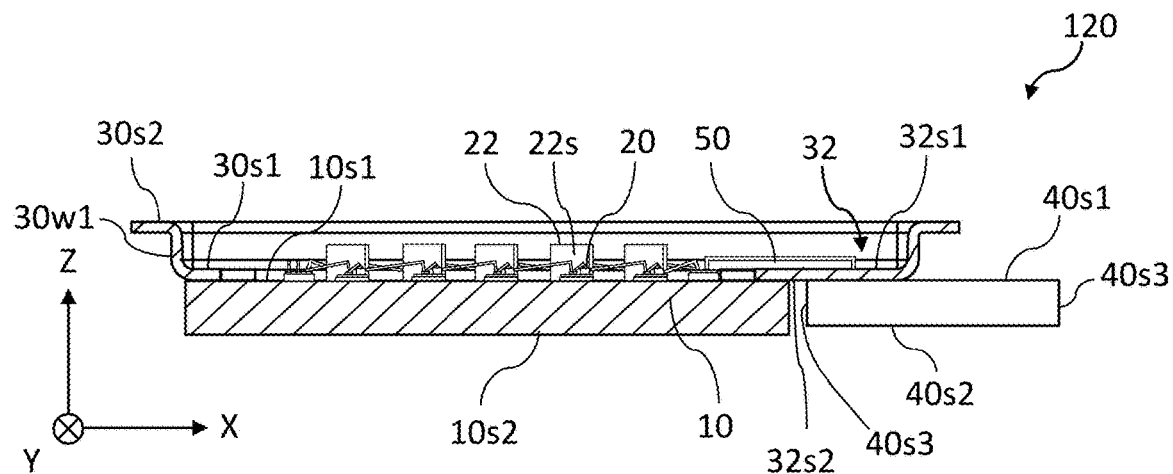
FIG. 4B is a cross-sectional view of the light emission device shown in FIG. 4A as taken along the XZ plane, in which similar elements are omitted from illustration

In the example shown in FIG. 4A and FIG. 4B, the frame body 30 includes: a first upper surface 30s1 and a second upper surface 30s2; and first side walls 30w1 coupling between the first upper surface 30s1 and the second upper surface 30s2. On the other hand, as compared to the example shown in FIG. 2B and FIG. 2C, the frame body 30 lacks elements corresponding to the second side walls 30w2 and the third upper surface 30s3. Moreover, the flat region 32 is provided in the first upper surface 30s1. The first side walls 30w1 provide a safety region that prevents any wiring lines 50 connecting to the electrical conduction member 40 from coming into contact with the lid 60. The light emission device 120 allows the distance from the first light-reflective members 22a and the second light-reflective members 22b to the optical member 70 to be reduced.

Next, with reference to FIG. 5 and FIG. 6, examples of light emission devices that include a frame body 30 that is sized larger along the Z direction than that of the light emission device 100 in FIG. 1A will be described.

Figure 5:
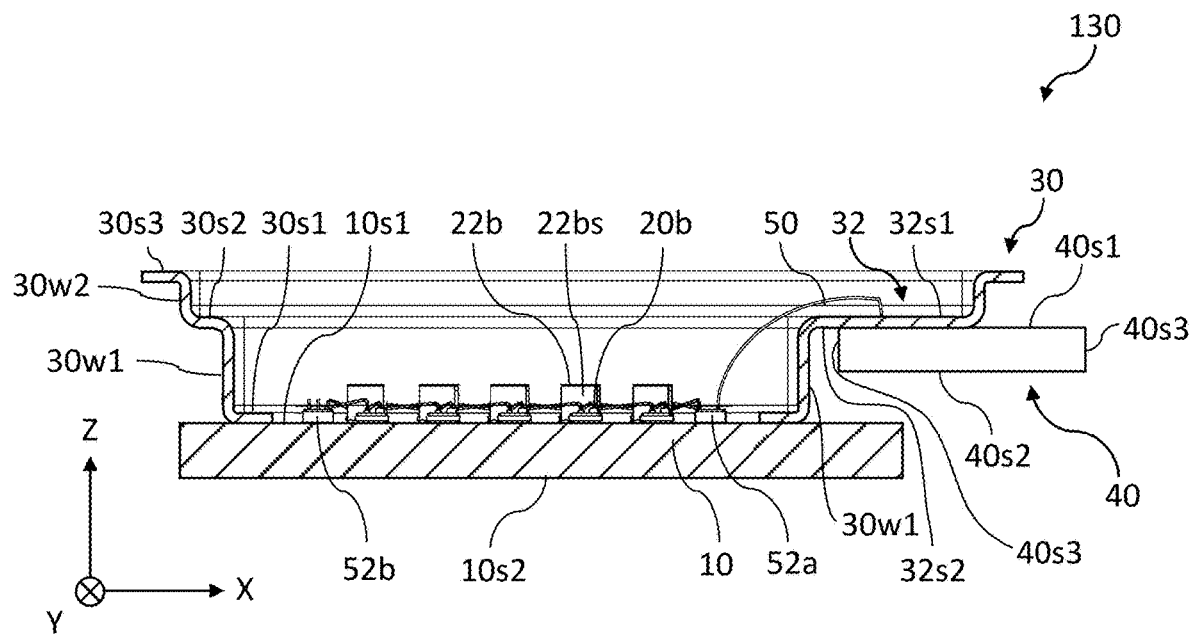
FIG. 5 is a cross-sectional view schematically showing a light emission device according to a third variation as taken along the XZ plane, in which a lid and an optical member are omitted from illustration.

FIG. 5 is a cross-sectional view schematically showing a light emission device 130 according to a third variation as taken along the XZ plane. FIG. 6 is a cross-sectional view schematically showing a light emission device 140 according to a fourth variation as taken along the XZ plane. All component elements of the light emission device 130 but the frame body 30 and the wiring lines 50 are as illustrated in the foregoing description of the light emission device 100.

In the example shown in FIG. 5, the flat region 32 is disposed directly above a portion of the upper surface 10s1 of the base part 10. In other words, in a top plan view, the flat region 32 overlaps a portion of the upper surface 10s1 of the base part 10. Moreover, the electrical conduction member 40 is disposed so that a portion thereof fits in a concaved recess that is created by the upper surface 10s1, the first side walls 30w1, and the flat region 32. Therefore, the size of the first side walls 30w1 along the Z direction is larger than the thickness of the electrical conduction member 40 along the Z direction. Because of the high-rising first side walls 30w1, portions of the wiring lines 50 that connect between the first relay members 52a and the electrical conduction member 40 are longer than in the example shown in FIG. 2C.

Figure 6:
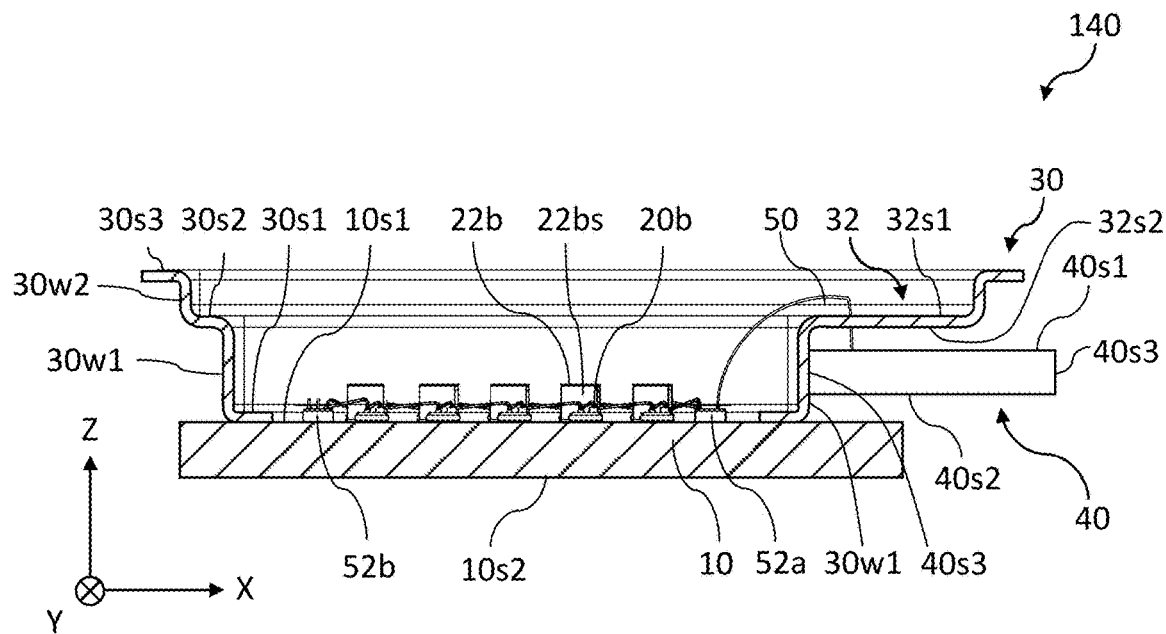
FIG. 6 is a cross-sectional view schematically showing a light emission device according to a fourth variation as taken along the XZ plane, in which a lid and an optical member are omitted from illustration.

In the example shown in FIG. 6, the electrical conduction member 40 is bonded to the first side walls 30w1. Moreover, similarly to FIG. 5, a portion of the electrical conduction member 40 fits in a concaved recess in the frame body 30. The wiring lines 50 connect to the electrical conduction member 40 within the concaved recess. The positioning shown in FIG. 6 can be adopted for a light emission device that does not need to be hermetically sealed.

Next, with reference to FIG. 7A and FIG. 7B, an example of a light emission device of which semiconductor laser devices 20 are not disposed in two rows will be described.

Figure 7A:
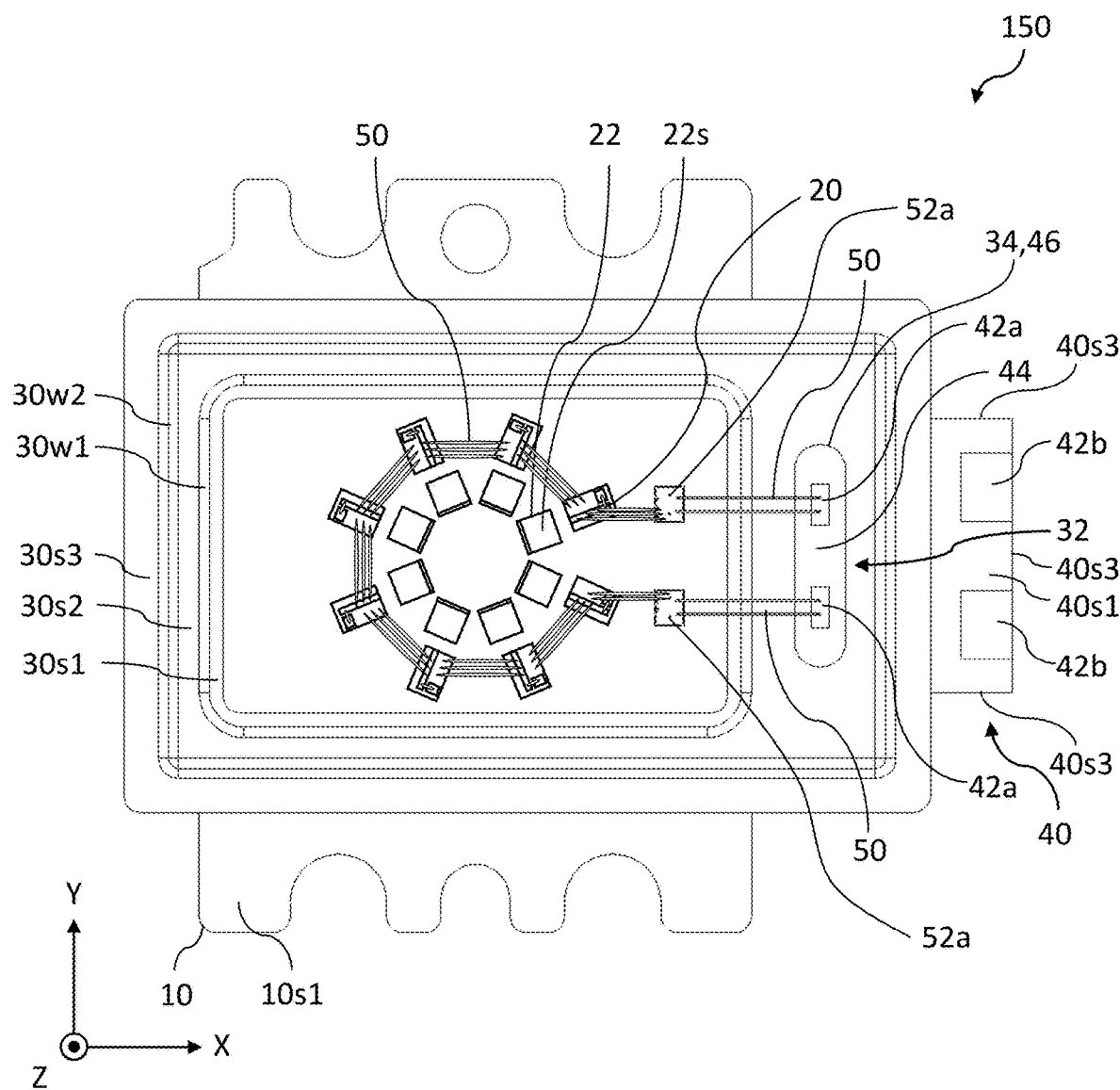
FIG. 7A is a plan view schematically showing a light emission device according to a fifth variation, in which a lid and an optical member are omitted from illustration.

FIG. 7A is a plan view schematically showing a light emission device 150 according to a fifth variation. FIG. 7B is a plan view schematically showing a lid 60 and an optical member 73 thereon according to the fifth variation. In the example of the light emission device 150 shown in FIG. 7A, the lid 60 and the optical member 73 are omitted from illustration. The light emission device 150 is similar to the light emission device 100 as described above, except for changes adapted to the different layout of the semiconductor laser devices.

In the light emission device 150, the plurality of semiconductor laser devices 20 are disposed in an annular arrangement. In order to realize the annular arrangement, at least six or more semiconductor laser devices are provided. In the example shown in FIG. 7A, eight semiconductor laser devices 20 are placed in an annular arrangement. Moreover, eight light-reflective members 22 are placed in an annular arrangement, across from the respectively corresponding semiconductor laser devices 20. The semiconductor laser devices 20 emit laser light toward reflective surfaces 22s of the light-reflective members 22.

In the fifth variation, first relay members 52a that assist in the connection from the semiconductor laser devices to the first conductive regions 42a are provided, while no second relay members 52b to assist in the connection from the first semiconductor laser devices 20a to the second semiconductor laser devices 20b are provided. Two first relay members 52a are provided correspondingly to the two first conductive regions 42a.

Figure 7B:
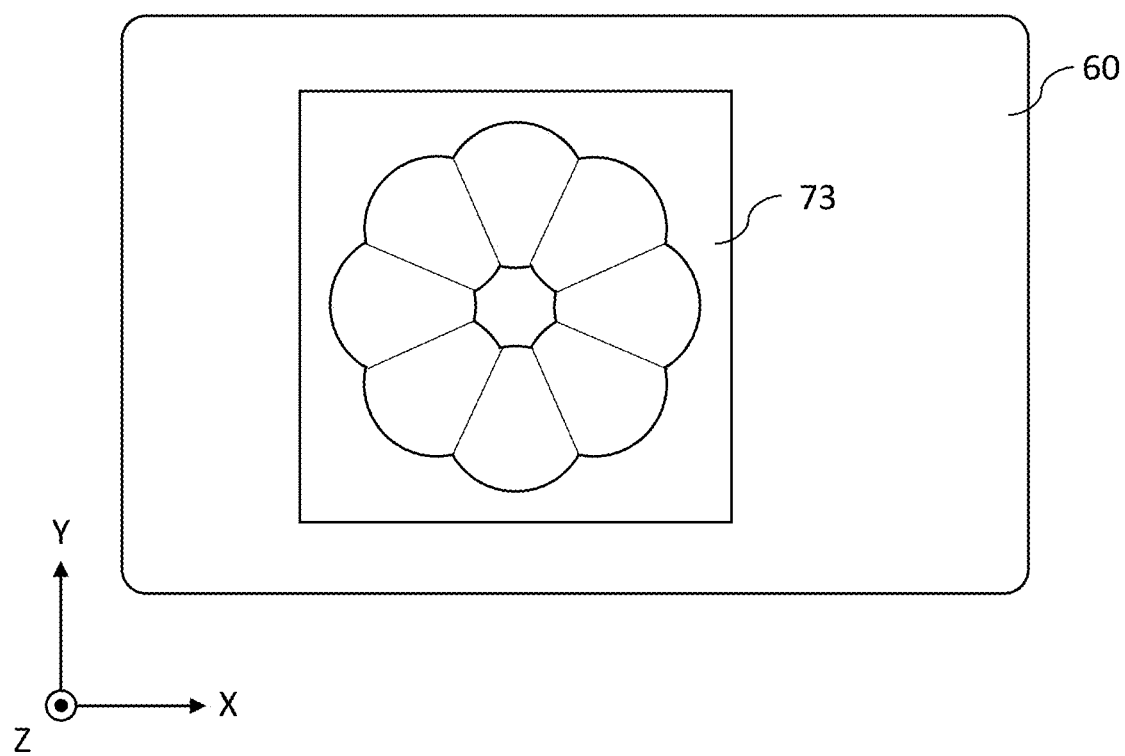
FIG. 7B is a plan view schematically showing a lid, and an optical member thereon, according to a fifth variation.

As shown in FIG. 7B, the optical member 73 on the lid 60 includes a plurality of lenses that are linked in an annular shape. In a top plan view, the lenses of the optical member 73 are located so as to overlap the respective reflective surfaces 22s, such that laser light that is emitted from the semiconductor laser devices 20 and reflected by the reflective surfaces 22s passes through these lenses.

Note that each of the above-described light emission device does not need to include all of the illustrated constituent components, but may only include constituent components that are adapted to the respective intended use.

A light emission device according to the present disclosure is applicable not only to a projector or a lighting device, but also to an optical communication system, and an optical device in a printing device or a measurement device, for example.

What is claimed is:

1. A light emission device comprising:
a base part having an upper surface and a lower surface;
one or more semiconductor laser devices disposed on the upper surface of the base part;
a frame body having a flat region that is above the lower surface of the base part and outside a region in which the one or more semiconductor laser devices are disposed, the flat region extending in a lateral direction, and the frame body having a throughhole that extends from an upper surface to a lower surface of the flat region;
an electrical conduction member disposed on a lower surface side of the flat region, the electrical conduction member including on an upper surface thereof a first conductive region and an insulative region, such that the first conductive region and the insulative region are located in a region defined by the throughhole of the frame body in a top plan view; and
wiring having an end that is bonded to the first conductive region of the electrical conduction member to electrically connect the one or more semiconductor laser devices.

2. The light emission device of claim 1, further comprising:
a lid that is bonded to the frame body,
wherein a bonding surface at which the frame body is bonded to the lid is located above an upper surface that includes the flat region.

3. The light emission device of claim 2, wherein:
the lid comprises a light-transmissive member, and a supporting member that supports the light-transmissive member; and
light that is emitted from the one or more semiconductor laser devices passes through the light-transmissive member.

4. The light emission device of claim 1, wherein the frame body includes no more than one throughhole for electrical conduction.

5. The light emission device of claim 1, wherein the upper surface of the electrical conduction member and the lower surface of the frame body in the flat region are bonded.

6. The light emission device of claim 1, wherein:
the one or more semiconductor laser devices comprise a plurality of semiconductor laser devices;
the light emission device further comprises a plurality of light-reflective members, each configured to reflect light that is emitted from a corresponding one of the plurality of semiconductor laser devices;

the plurality of semiconductor laser devices are arranged in two rows; and each of the light-reflective members is provided between the two rows of the semiconductor laser devices.

7. The light emission device of claim 1, wherein:

the one or more semiconductor laser devices comprise a plurality of semiconductor laser devices arranged in rows and columns, such that each row includes more laser devices than does each column; and the flat region of the frame body extends along a row direction.

8. The light emission device of claim 1, wherein the upper surface of the electrical conduction member extends outward of a region in which the flat region of the frame body is contained.

9. The light emission device of claim 8, wherein:

the electrical conduction member includes a second conductive region that is provided at a region of the upper surface other than the region defined by the through-hole of the frame body in the top plan view; and the first conductive region and the second conductive region are electrically connected.

10. The light emission device of claim 1, wherein the electrical conduction member includes a second conductive region at a lower surface thereof.

11. The light emission device of claim 1, wherein the electrical conduction member includes a second conductive region at a side surface thereof.

12. The light emission device of claim 1, wherein the frame body is bonded to the upper surface of the base part so as to surround the one or more semiconductor laser devices disposed on the upper surface of the base part in plan view.

* * * * *